(12) United States Patent
Sims

(10) Patent No.: US 7,872,212 B2
(45) Date of Patent: Jan. 18, 2011

(54) USE OF MESA STRUCTURES FOR SUPPORTING HEATERS ON AN INTEGRATED CIRCUIT

(75) Inventor: Tyler Sims, Knoxville, TN (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 243 days.

(21) Appl. No.: 12/270,310

(22) Filed: Nov. 13, 2008

(65) Prior Publication Data
US 2009/0070987 A1 Mar. 19, 2009

Related U.S. Application Data

(62) Division of application No. 10/701,728, filed on Nov. 5, 2003, now Pat. No. 7,465,903.

(51) Int. Cl.
*H05B 1/00* (2006.01)
*G02B 6/42* (2006.01)

(52) U.S. Cl. ............. 219/209; 385/16; 385/18; 385/19; 29/622; 29/611; 29/852

(58) Field of Classification Search ........... 219/209, 219/535, 536, 538; 385/16, 18, 19; 29/825, 29/622, 600, 611, 620, 852
See application file for complete search history.

(56) References Cited

U.S. PATENT DOCUMENTS

| | | | |
|---|---|---|---|
| 3,944,447 A | 3/1976 | Magdo et al. | |
| 3,988,823 A | 11/1976 | Hu | |
| 4,935,752 A * | 6/1990 | Hawkins | 347/62 |
| 4,951,063 A | 8/1990 | Hawkins et al. | |
| 5,045,870 A * | 9/1991 | Lamey et al. | 347/59 |
| 5,257,042 A | 10/1993 | Buhler | |
| 5,699,462 A * | 12/1997 | Fouquet et al. | 385/18 |
| 5,754,714 A | 5/1998 | Suzuki et al. | |
| 6,195,478 B1 | 2/2001 | Fouquet et al. | |
| 6,320,994 B1 | 11/2001 | Donald et al. | |
| 6,324,316 B1 | 11/2001 | Fouquet et al. | |
| 6,331,044 B2 | 12/2001 | Sleger et al. | |
| 6,459,828 B1 | 10/2002 | Andersen | |
| 6,487,333 B2 | 11/2002 | Fouquet et al. | |
| 6,678,435 B2 | 1/2004 | Pan et al. | |
| 6,706,546 B2 | 3/2004 | Yoshimura et al. | |
| 6,718,085 B1 | 4/2004 | Scholz et al. | |
| 6,961,495 B2 | 11/2005 | Tsai et al. | |
| 6,999,649 B1 | 2/2006 | Chen et al. | |
| 7,031,564 B2 | 4/2006 | Sims | |
| 7,172,269 B2 | 2/2007 | Sims | |
| 7,178,904 B2 * | 2/2007 | Anderson et al. | 347/63 |
| 2004/0071595 A1 | 4/2004 | Neeper et al. | |
| 2004/0124846 A1 | 7/2004 | Yamashita et al. | |
| 2004/0258258 A1 | 12/2004 | Sims | |

FOREIGN PATENT DOCUMENTS

GB   2174212   10/1986

* cited by examiner

*Primary Examiner*—Tu B Hoang
*Assistant Examiner*—Vinod D Patel

(57) ABSTRACT

An integrated circuit is joined to a liquid container. The integrated circuit includes a passivation layer. A resistor is used as a heater to heat fluid in a liquid container. A mesa structure is formed over the passivation layer. The mesa structure is in contact with the resistor and is used to more effectively deliver heat from the resistor to the liquid container.

9 Claims, 6 Drawing Sheets

USE OF MESA STRUCTURES FOR SUPPORTING HEATERS ON AN INTEGRATED CIRCUIT

This patent application is a divisional application of parent U.S. patent application Ser. No. 10/701,728 filed Nov. 5, 2003 entitled "Use of Mesa Structures for Supporting Heaters on an Integrated Circuit" to Tyler Sims, and claims priority and other benefits therefrom. The foregoing '728 patent application is hereby incorporated by reference herein, in its entirety.

BACKGROUND

The present invention relates to components useful in optical switching devices and pertains particularly to the use of mesa structures for supporting heaters on an integrated circuit.

Optical fibers provide significantly higher data rates than electronic paths. However, effective utilization of the greater bandwidth inherent in optical signal paths requires optical cross-connect switches.

One type of optical cross-connect switch utilizes total internal reflection (TIR) switching elements. A TIR element consists of a waveguide with a switchable boundary. Light strikes the boundary at an angle. In the first state, the boundary separates two regions having substantially different indices of refraction. In this state the light is reflected off of the boundary and thus changes direction. In the second state, the two regions separated by the boundary have the same index of refraction and the light continues in a straight line through the boundary. The magnitude of the change of direction depends on the difference in the index of refraction of the two regions. To obtain a large change in direction, the region behind the boundary must be switchable between an index of refraction equal to that of the waveguide and an index of refraction that differs markedly from that of the waveguide.

One type of TIR element is taught in U.S. Pat. No. 5,699,462 which is hereby incorporated by reference. The TIR element taught in this patent utilizes thermal activation to displace liquid from a gap at the intersection of a first optical waveguide and a second optical waveguide. In this type of TIR, a trench is cut through a waveguide. The trench is filled with an index-matching liquid. A bubble is generated at the cross-point by heating the index matching liquid with a localized heater. The bubble must be removed from the cross-point to switch the cross-point from the reflecting to the transmitting state and thus change the direction of the output optical signal. Efficient operation of such a TIR element requires effective placement and operation of heating devices within and around the TIR elements.

SUMMARY OF THE INVENTION

An integrated circuit is joined to a liquid container. The integrated circuit includes a passivation layer. A resistor is used as a heater to heat fluid in the liquid container. A mesa structure is formed over the passivation layer. The mesa structure is in contact with the resistor and is used to more effectively deliver heat from the resistor to the liquid container.

DETAILED DESCRIPTION OF EMBODIMENTS OF THE PRESENT INVENTION

Figure 1:
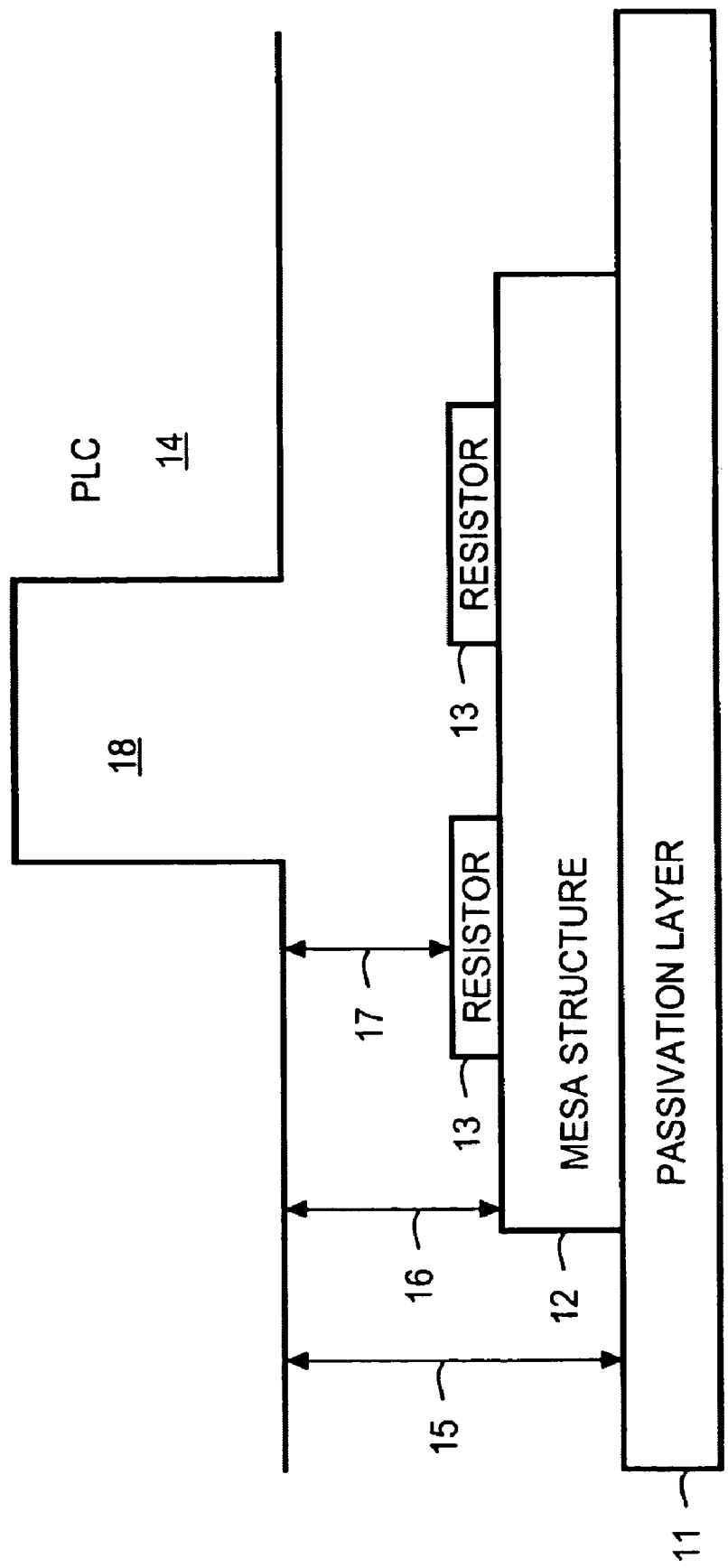
FIG. 1 shows a resistor formed on a mesa structure in accordance with an embodiment of the present invention.

FIG. 1 shows a resistor 13 formed on a mesa structure 12. Mesa structure 12 is formed over a chip passivation layer 11. For example, chip passivation layer 11 is formed using TEOS or another type of oxide deposition process or other passivating material process. Mesa structure 12 is formed, for example, using two layers of TEOS formed by depositing a first layer of TEOS, performing a resistive etch back, and then depositing a second layer of TEOS. Resistor 13 is, for example, a resistor ring with two ends showing in FIG. 1. The resistor ring is not a complete circle, but is at least a semi-circle. For example, resistor 13 is made of Tantalum Aluminum (TaAl).

Mesa structure 12 places resistor 13 closer to a trench 18 in planar light circuit (PLC) 14. PLC 14 is joined to the integrated circuit containing mesa structure 12, for example, by wafer bonding or soldering along the edges of the integrated circuit and PLC 14. Resistor 13 is used as a heater for bubble formation in trench 18. Trench 18 intersects a waveguide within PLC 14. Mesa structure 14 also increases the thermal resistance and decreases the fluidic resistance for the gap between PLC 14 and the integrated circuit on which passivation layer 11 is formed. A typical gap distance between passivation layer 11 and PLC 14, as represented by arrow 15, is 5 microns. A typical gap distance between mesa structure 12 and PLC 14, as represented by arrow 16, is 3.5 microns. A typical gap distance between resistor 13 and PLC 14, as represented by arrow 17, is 2.9 microns. Mesa structure 12 and resistor 13 can alternatively be joined to a vertical inkjet tube and used for heating droplets of ink ejected from the tube.

Figure 2:
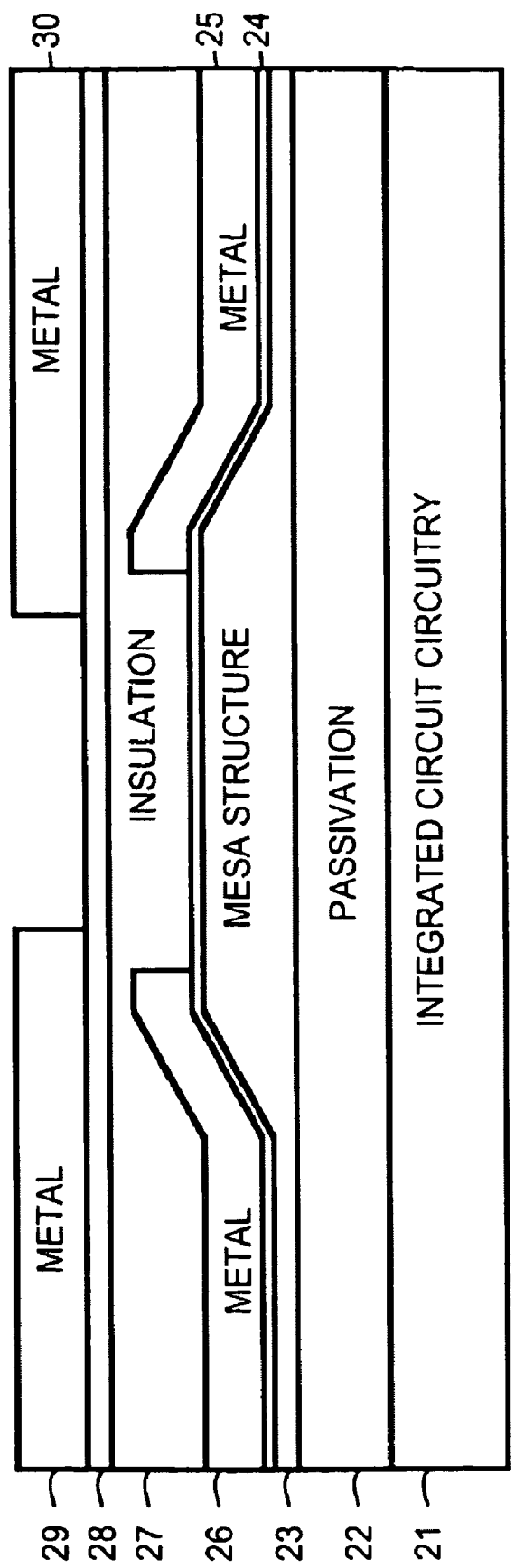
FIG. 2 shows layered resistors formed on a mesa structure in accordance with another embodiment of the present invention.

FIG. 2 shows layered resistors formed on a mesa structure in accordance with another embodiment of the present invention. The mesa structure is useful, for example, in constructing a heater used in a TIR element or an inkjet tube. Over integrated circuit circuitry 21 is placed a passivation layer 22 of field oxide (Fox). For example passivation layer 22 is approximately one micron thick. Over passivation layer 22 is placed a mesa structure 23. For example, mesa structure 23 varies in thickness with a maximum thickness of approximately one micron. Mesa structure 23 is composed of, for example, reflowed BoroPhosphoSilicate Glass (BPSG) or some other insulating material.

Over mesa structure 23 is placed a bottom resistive layer 24. For example, bottom resistive layer 24 is composed of Tantalum. A bottom metal lead 25 and a bottom metal lead 26 are formed on top of bottom resistive layer 24. Current between bottom metal lead 25 and bottom metal lead 26 flows only through bottom resistive layer 24, generating heat. An insulating layer 27 is placed over bottom metal lead 25, bottom metal lead 26 and exposed portion of bottom resistive layer 24. For example, insulating layer 27 is composed of SiO2 or some other insulating material. For example, insulating layer 27 is approximately 1.2 to 1.4 microns thick.

Over insulating layer 27 is placed a top resistive layer 28. For example, top resistive layer 28 is composed of Tantalum Aluminum (TaAl). A top metal lead 29 and a top metal lead 30 are formed on top of top resistive layer 28. Current flows between top metal lead 29 and top metal lead 30 flows only through top resistive layer 27, generating heat. A passivation layer (not shown) can be placed over top metal lead 29, top metal lead 30 and exposed portion of top resistive layer 27. Additional layers of resistors and metal leads can be used to add additional resistors.

Figure 3:
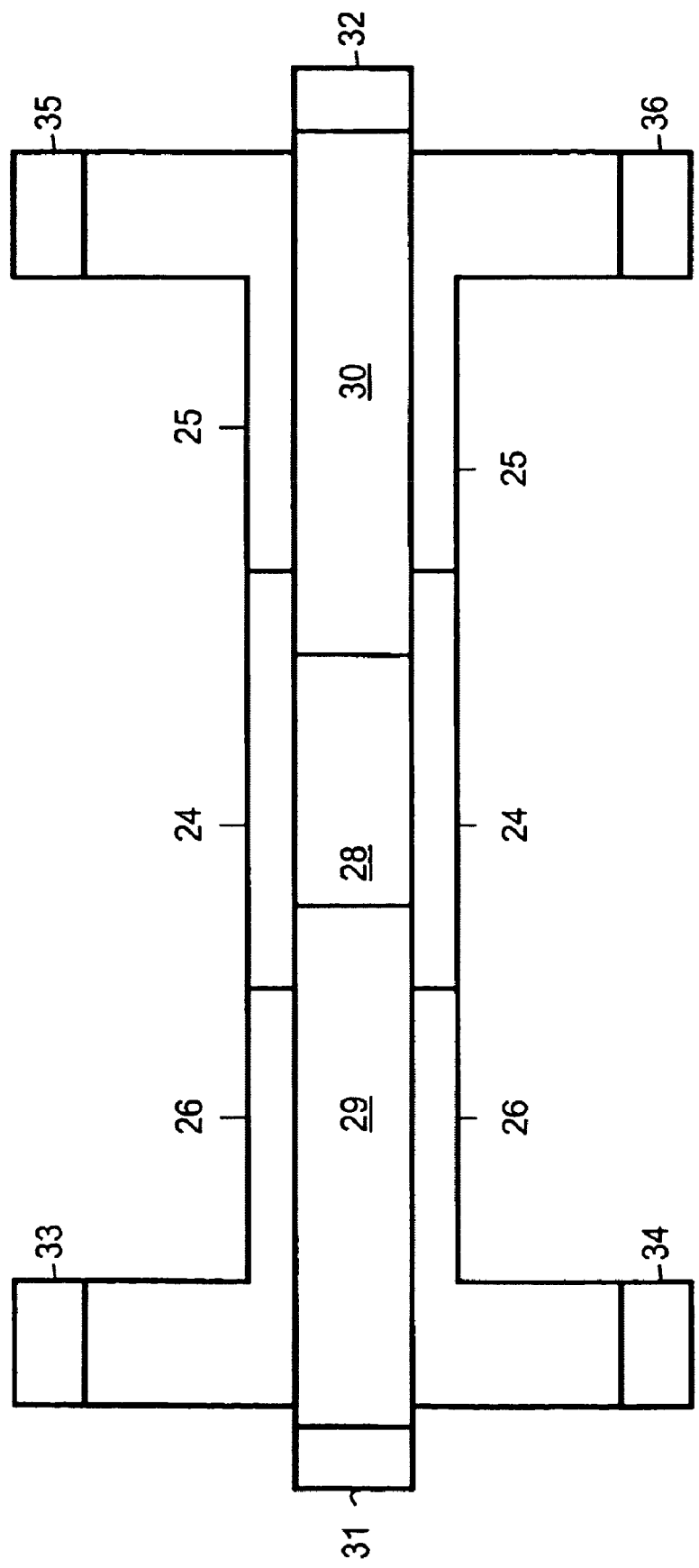
FIG. 3 is a simplified top view of the layered resistors and mesa structure shown in FIG. 2.

FIG. 3 is a simplified top view of the layered resistors and mesa structure shown in FIG. 2. Bottom metal lead 26 is shown connected to a voltage source (Vpp) region 33 and a Vpp region 34. Bottom metal lead 25 is shown connected to a ground region 35 and a ground region 36. Top metal lead 29 is shown connected to a Vpp region 31. Top metal lead 30 is shown connected to a ground region 32.

As shown in FIG. 3, the portion of bottom resistive region 24 not covered by metal leads has a larger area than the portion of top resistive region 28 not covered by metal leads. For example, the uncovered portion of bottom resistive region 24 has an area of 18 microns by 50 microns while the uncovered portion of top resistive region 28 has an area of 6 microns by 40 microns.

The use of multilevel resistors, as shown in FIGS. 2 and 3, allows more total power to be put in an area, while reducing the current necessary for each resistor. For example, bottom resistive region 24 can be used to assist heating during a "burn-in" period of top resistive region 28. Bottom resistive region 24 then can optionally still be used as a "warming resistor with top resistive region 28 until bottom resistive region 24 begins to "age". Then during the remaining life of the circuit, top resistive region 28 can be used exclusively to produce heat.

Figure 4:
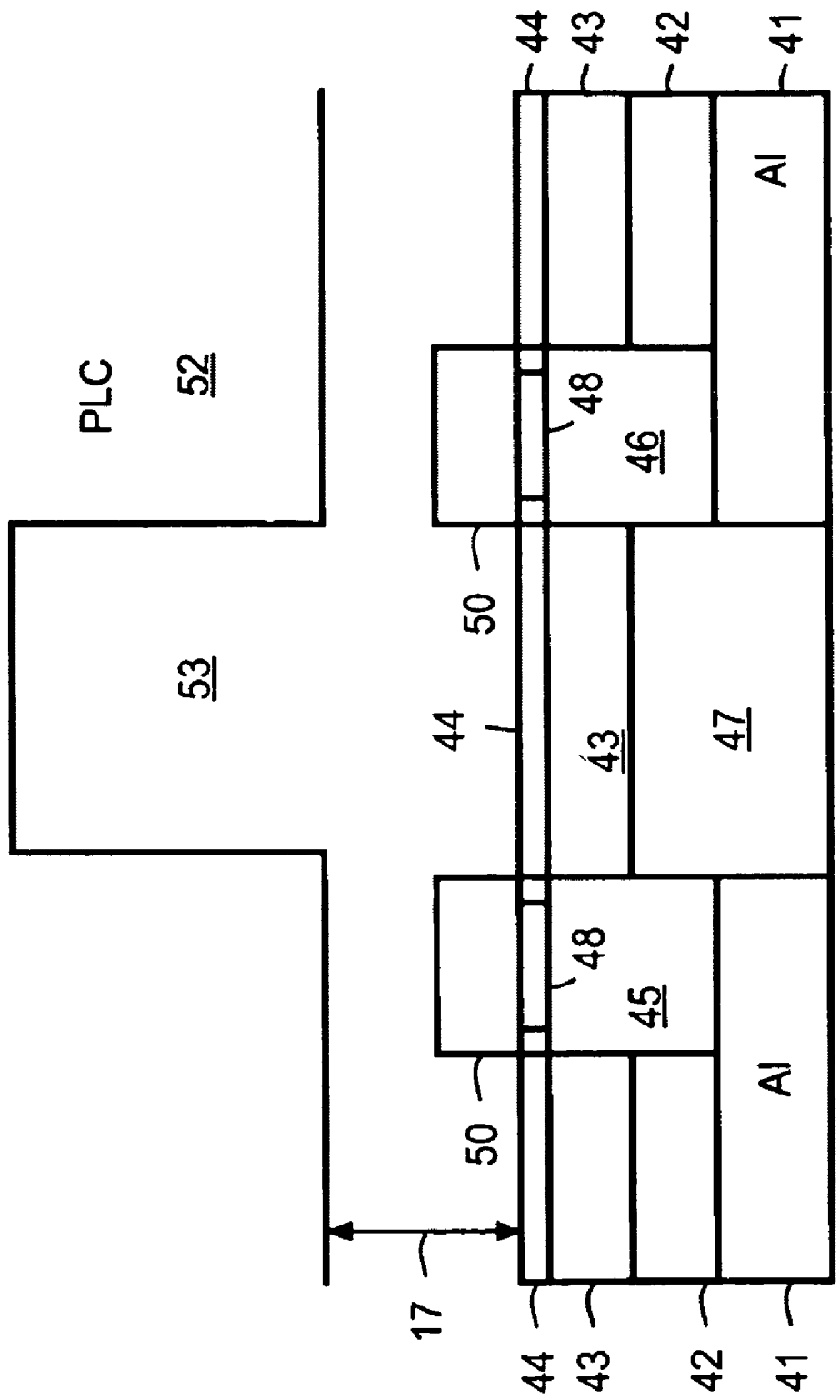
FIG. 4 shows vias connected to a resistor formed on a mesa structure in accordance with another embodiment of the present invention.

FIG. 4 shows an alternative embodiment in which a via 45 and a via 46 are used to connected to separate ends of a resistor ring 50. A mesa structure is composed of an insulating layer 42 and an insulating layer 43 placed over a metal layer 41. For example, metal layer 41 is composed of aluminum. For example, insulating layer 42 and insulating layer 43 are formed of TEOS or another insulating material. After insulating layer 42 is deposited on metal layer 41, a resistive etch back is performed before insulating layer 43 is deposited on insulating layer 42. Insulating region 47 is composed of TEOS or another insulating material or combination of insulating materials. Via 45 and via 46 are composed of, for example, Aluminum (Al) and Tantalum Aluminum (Ta+Al) or another conductive material. A resistor ring 48 is deposited over via 45 and via 46. FIG. 4 shows the two ends of resistor ring 48. At locations not occupied by resistor ring 48, a passivation layer 44 composed of, for example, SiC and Si3N4, is formed. A ring pillar structure 54 is used to radiate heat from resistor ring 48 along sidewalls within the bubble chamber formed by the volume within ring pillar structure 54 and the volume within trench 53 of PLC 52. For example, resistor ring 48 is formed of Tantalum Aluminum. For example, ring pillar structure 54 is composed of gold, a metal layer coated with an insulating layer, or an insulating structure covered with a metal layer. A gap length between PLC and passivation layer, represented by arrow 17, is five microns. The mesa structure is useful, for example, in constructing a heater used in a TIR element or an inkjet tube.

Figure 5:
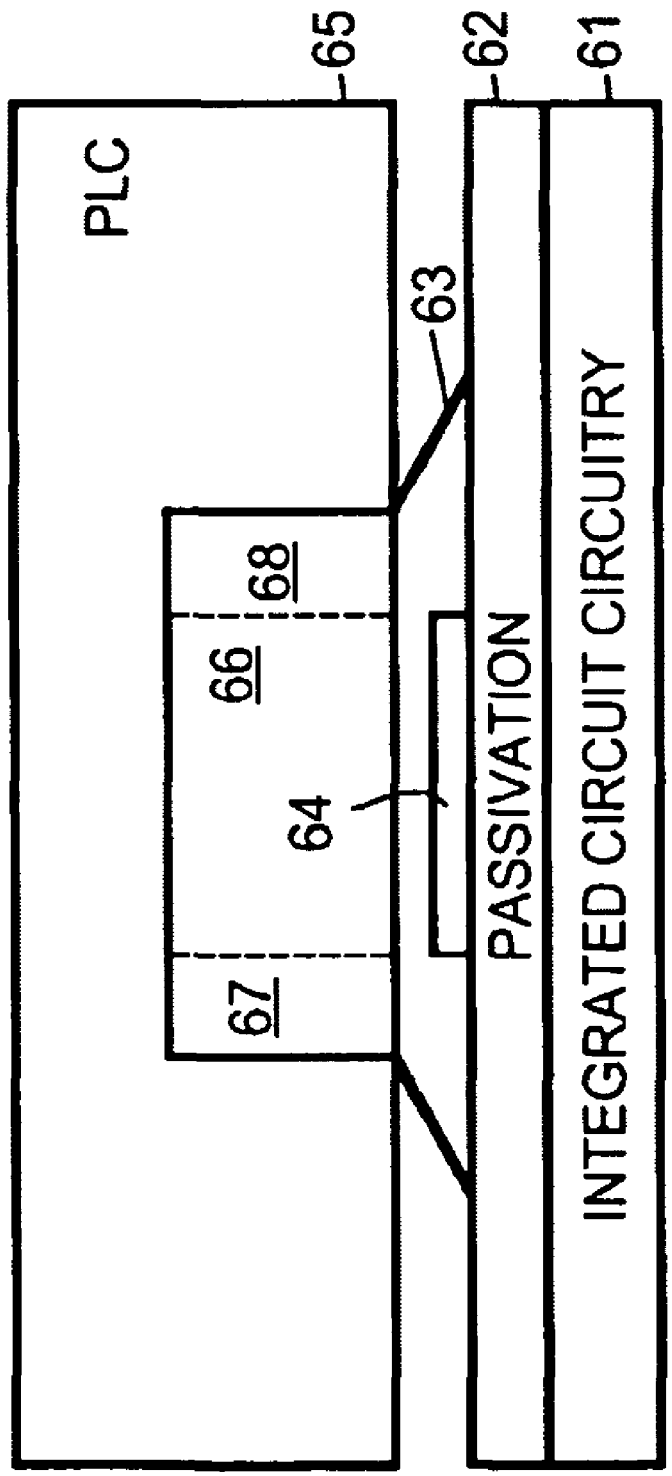
FIG. 5 shows a resistor formed within a mesa structure in accordance with another embodiment of the present invention.

FIG. 5 shows another embodiment of the present invention where resistors 64 are formed beneath a mesa structure 63.

Over integrated circuit circuitry 61 is formed a passivation layer 62 composed of, for example, SiO2. Resistors 64 are formed over passivation layer 62. Mesa structure 63 is formed over and around resistors 64. For example, mesa structure 63 is composed of a pyrolytic material such as porous silicon. For example, mesa structure 63 is formed using sputtered silicon. For example, when forming mesa structure 63 on SiO2 regions, underlying adhesion layers or coatings are selected for matched stress with mesa structure 63. For example, depending on the particular implementation, an adhesion layer can be formed of a material with a layered structure of titanium tungsten (TiW), silicon and TiW.

Resistors 64 are used for bubble formation in trench 66 within PLC 65. Trench 66 intersects a waveguide within PLC 65. Regions 67 and 68 of trench 66 are necks which do not include reflecting walls. The remaining length of trench 66 (outside of the necks) has reflecting walls used to transmit or reflect light, depending upon whether trench 66 is filled respectively with liquid or a bubble.

The pyrolytic material used to form mesa structure 63 is chosen and formed to have heat transfer in a vertical direction that is significantly more efficient than heat transfer in a horizontal direction. This allows for an optimized transfer of heat vertically from resistors 64 to the reflecting walls of trenches 66. Mesa structure 63 is a standoff structure with a large area which reduces stress when PLC 14 (shown in FIG. 5) is joined to the integrated circuit containing integrated circuit circuitry 61, for example, by wafer bonding or solder. Mesa structure 63 is easy to deposit and pattern and forms part of a high temperature compatible stack where voiding and hillocking do not occur during manufacture or later use. Mesa structure 63 and resistors 64 can alternatively be joined to a vertical inkjet tube and used for heating droplets of ink ejected from the tube.

Figure 6:
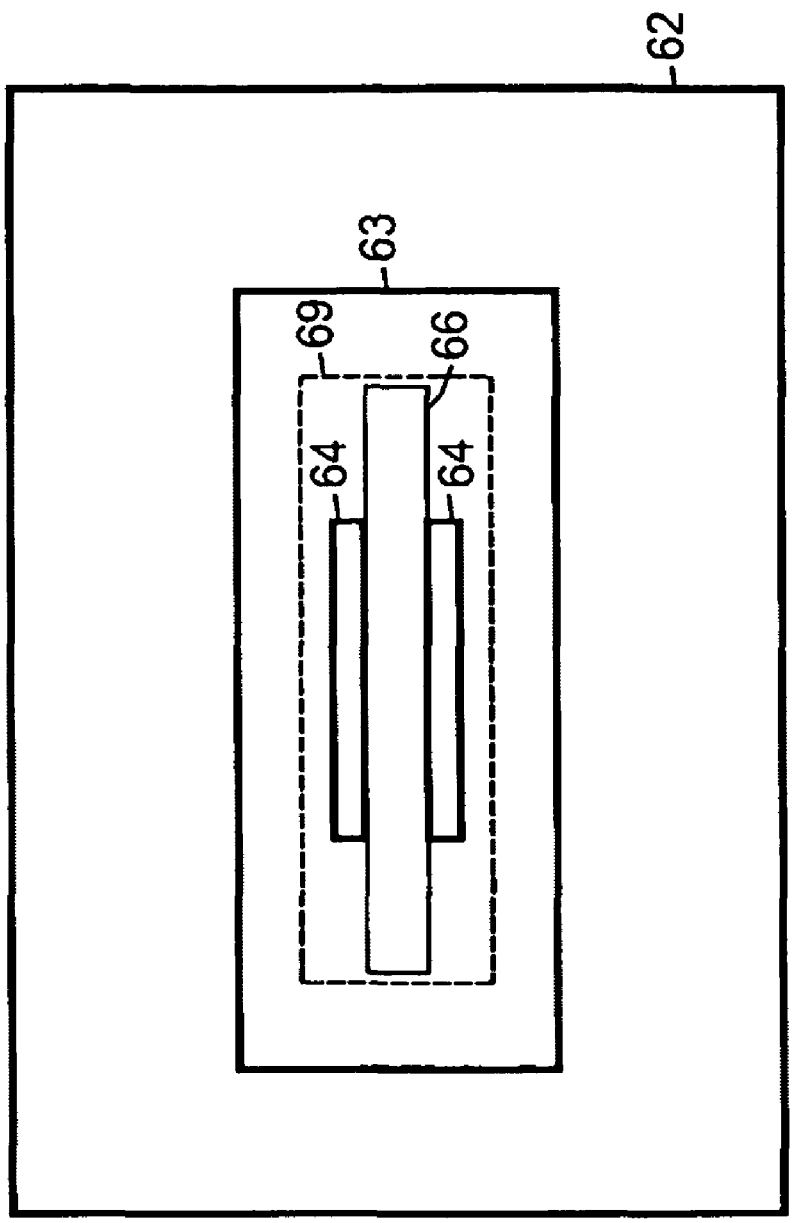
FIG. 6 is a simplified top view of the resistor formed within the mesa structure as shown in FIG. 5.

FIG. 6 is a simplified top view that shows location of trench 66 with respect to resistors 64 and mesa structure 63. For example trench 66 has a width of 9 to 12 microns. Trench 66 extends along resistors 64 a length of approximately 60 microns. Dashed line 69 outlines the top plane of mesa structure 63.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for making an optical switch comprising a planar light circuit (PLC), an integrated circuit (IC) and a mesa structure, the method comprising:

forming a passivation layer atop the IC;

forming the mesa structure atop the passivation layer such that the mesa structure is separated from the IC by the passivation layer and operably connected to metal leads corresponding thereto;

forming a waveguide and a trench in an underside of the PLC, the trench being configured to intersect the waveguide at a cross-point disposed above the mesa structure, and forming, for positioning between the mesa structure and the PLC, at least top and bottom resistive layers, the top and bottom resistive layers being separated by an insulating layer disposed therebetween, a first portion of the bottom resistive layer not covered by the metal leads having a surface area larger than a second portion of the top resistive layer not covered by the metal leads, the top and bottom resistive layers being configured to heat the liquid in the trench and thereby effect a change in an index of refraction of the liquid in response to electrical current passing through the top and bottom resistive layers;

wherein at least portions of the mesa structure project upwardly above the passivation layer and the top surface of the IC, and at least a portion of the bottom resistive layer is conformably disposed above the upwardly projecting portion of the mesa structure and thereby placed within close proximity to the liquid in the trench to effect efficient heating of the liquid.

2. A method as in claim 1 wherein the mesa structure comprises a pyrolytic material.

3. A method as in claim 2, wherein the mesa structure comprises sputtered silicon.

4. A method as in claim 1, wherein forming the mesa structure further comprises:

forming a first TEOS layer;

performing a resistive etch back of the first TEOS layer; and, forming a second TEOS layer over the first TEOS layer.

5. A method as in claim 1, further comprising:

forming vias through the mesa structure.

6. A method as in claim 1, further comprising:

joining the PLC to the IC by at least one of wafer bonding and soldering.

7. A method as in claim 1, further comprising:

configuring the bottom resistive layer to assist heating of the top resistive layer during a burn-in period.

8. A method as in claim 1, further comprising:

forming a pillar structure over the resistor.

9. A method as in claim 1, further comprising:

configuring at least one of the top resistive layer and the bottom resistive layer to form a bubble in the liquid when electrical current is passed therethrough.

* * * * *